United States Patent [19]
Gardner et al.

[11] Patent Number: 6,074,919
[45] Date of Patent: Jun. 13, 2000

[54] METHOD OF FORMING AN ULTRATHIN GATE DIELECTRIC

[75] Inventors: Mark I. Gardner, Cedar Creek; Thien T. Nguyen, Austin, both of Tex.

[73] Assignee: Advanced Micro Devices, Inc., Austin, Tex.

[21] Appl. No.: 09/234,561

[22] Filed: Jan. 20, 1999

[51] Int. Cl.$^7$ .................................................. H01L 21/336
[52] U.S. Cl. .......................... 438/287; 438/300; 438/305
[58] Field of Search .................................... 438/259, 261, 438/263, 264, 287, 299, 300, 301, 303, 305, 306, 517, 585, 589, 591, 592, 594, 595, 976

[56] References Cited

U.S. PATENT DOCUMENTS

| | | | |
|---|---|---|---|
| 3,749,610 | 7/1973 | Swann et al. ............................ | 438/301 |
| 4,364,166 | 12/1982 | Crowder et al. ......................... | 438/301 |
| 5,120,668 | 6/1992 | Hsu et al. ................................ | 438/301 |
| 5,194,926 | 3/1993 | Hayden .................................... | 257/565 |
| 5,597,752 | 1/1997 | Niwa ........................................ | 438/305 |

*Primary Examiner*—Charles Bowers
*Assistant Examiner*—Jack Chen
*Attorney, Agent, or Firm*—Williams, Morgan & Amerson

[57] ABSTRACT

A method is provided for fabricating a transistor, the method including forming a semiconducting layer above a substrate layer, forming a first dielectric layer above the semiconducting layer and forming a sacrificial layer above the first dielectric layer. The method also includes forming an opening in the sacrificial layer, the first dielectric layer and the semiconducting layer to expose a channel region in the substrate layer. The method further includes forming a gate dielectric above the channel region in the substrate layer within the opening and forming a gate conductor above the gate dielectric within the opening. Moreover, the method includes removing the sacrificial layer to expose sides of the gate conductor and introducing a dopant into the semiconducting layer to form doped source/drain regions. In addition, the method includes forming dielectric spacers adjacent the gate conductor.

20 Claims, 6 Drawing Sheets

METHOD OF FORMING AN ULTRATHIN GATE DIELECTRIC

BACKGROUND OF THE INVENTION

1. Field of the Invention

This invention relates generally to semiconductor fabrication technology and, more particularly, to a method of fabricating a transistor.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

However, the reduction in the channel length also requires a reduction in the depth of the source/drain regions adjacent the gate conductor. It has proven difficult to form very shallow source/drain junctions. Furthermore, as source/drain junctions get shallower, the implantation to prevent punch-through also gets shallower. In turn, the shallower punch-through implant tends to invade the space of the threshold voltage ($V_{threshold}$ or $V_{th}$) implant. Thus, the concentration of boron would be greater at the surface of the silicon substrate in an N-channel metal oxide semiconductor FET (NMOSFET or NMOS transistor or NMOS), for example. This increased concentration of the punch-through dopant, in turn, tends to make the threshold voltage $V_{th}$ of the FET higher. Increases in the threshold voltage $V_{th}$ of a FET are undesirable for a number of reasons. For example, an increase in the threshold voltage $V_{th}$ tends to make an "enhanced mode" NMOS transistor harder to turn "ON" and may also result in the reduction of the drive current of the device.

Typically, overall reduction in scale of the components of a typical transistor to increase the overall speed of the MOSFET, or MOS transistor, and to increase the density, and number, of the transistors that can be produced on a given amount of wafer real estate, also requires a reduction in the thickness of the gate dielectric layer. It has proven difficult to form ultrathin gate dielectric layers along with very shallow source/drain junctions. Generally, the thinner the gate dielectric layer, the easier it is for charge carriers such as electrons to tunnel quantum mechanically through the gate dielectric layer between the channel and the gate conductor of the MOS transistor, for example.

The present invention is directed to overcoming, or at least reducing the effects of, one or more of the problems set forth above.

SUMMARY OF THE INVENTION

In one aspect of the present invention, a method is provided for fabricating a transistor, the method including forming a semiconducting layer above a substrate layer, forming a first dielectric layer above the semiconducting layer and forming a sacrificial layer above the first dielectric layer. The method also includes forming an opening in the sacrificial layer, the first dielectric layer and the semiconducting layer to expose a channel region in the substrate layer. The method further includes forming a gate dielectric above the channel region in the substrate layer within the opening and forming a gate conductor above the gate dielectric within the opening. Moreover, the method includes removing the sacrificial layer to expose sides of the gate conductor and introducing a dopant into the semiconducting layer to form doped source/drain regions. In addition, the method includes forming dielectric spacers adjacent the gate conductor.

BRIEF DESCRIPTION OF THE DRAWINGS

The invention may be best understood by reference to the following description taken in conjunction with the accompanying drawings, in which the leftmost significant digit(s) in the reference numerals denote(s) the first figure in which the respective reference numerals appear, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will, of course, be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for transistor fabrication according to the present invention are shown in FIGS. 1–15. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

In general, the present invention is directed towards the manufacture of a semiconductor device. As will be readily apparent to those skilled in the art upon a complete reading of the present application, the present method is applicable to a variety of technologies, for example, NMOS, PMOS, CMOS, and the like, and is readily applicable to a variety of devices, including, but not limited to, logic devices, memory devices, and the like.

Figure 1:
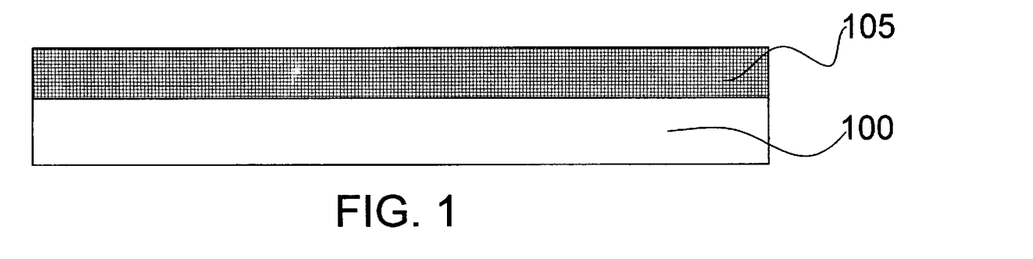
FIGS. 1–14 illustrate schematically in cross-section various embodiments of a method for transistor fabrication according to the present invention.
Figure 15:
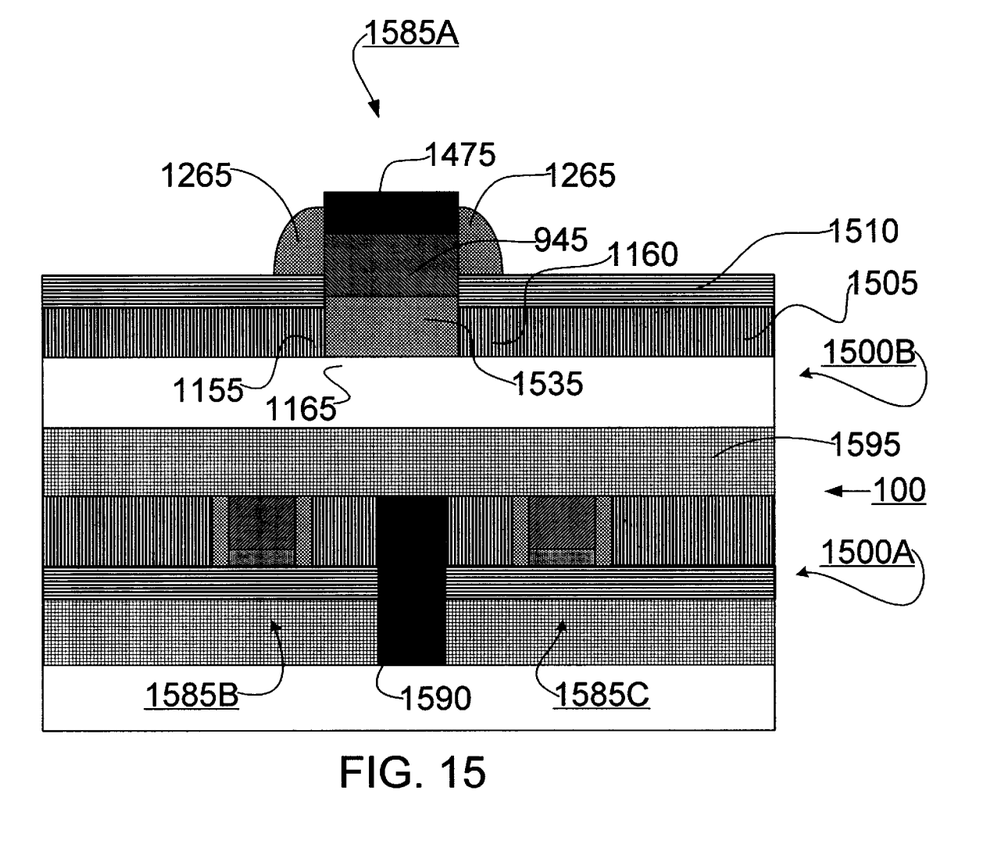
FIG. 15 illustrates schematically in cross-section another embodiment of a method for transistor fabrication according to the present invention.

As shown in FIG. 1, a semiconducting layer 105 may be formed above a structure 100 such as a semiconducting substrate. However, the present invention is not limited to the formation of a transistor above the surface of a semiconducting substrate such as a silicon wafer, for example. Rather, as will be apparent to one skilled in the art upon a complete reading of the present disclosure, a transistor formed in accordance with the present invention may be formed above previously formed semiconductor devices, e.g., transistors, or other similar structure. In effect, the present invention may be used to form transistors on top of previously formed transistors, as shown in FIG. 15, for example.

The semiconducting layer 105 may be formed by a variety of known techniques for forming such layers, e.g., chemical vapor deposition (CVD), low-pressure CVD (LPCVD), plasma-enhanced CVD (PECVD), sputtering and physical vapor deposition (PVD), and the like, and may have a thickness ranging from approximately 50–500 Å. Eventually, as described more fully below, portions of the semiconducting layer 105 will become the source/drain regions 1155 and 1160 (see FIG. 11) of the transistor 1585A (see FIG. 15). The semiconducting layer 105 may be undoped silicon (Si), germanium (Ge), gallium arsenide (GaAs), gallium phosphide (GaP), polysilicon, and the like.

In one illustrative embodiment, the semiconducting layer 105 is comprised of undoped Ge in Si (Si—Ge), having a thickness of approximately 50 Å, which is formed by an LPCVD process for higher throughput. The concentration of the Ge in the Si—Ge may be in a range of approximately 15–40%. As in the deposition of polysilicon by LPCVD or PECVD, for example, the deposition of the Si—Ge may be accomplished by introducing approximately 15–40% (by volume or flow) germane ($GeH_4$) process gas along with silane ($SiH_4$) process gas into the process chamber during the deposition process.

Figure 2:
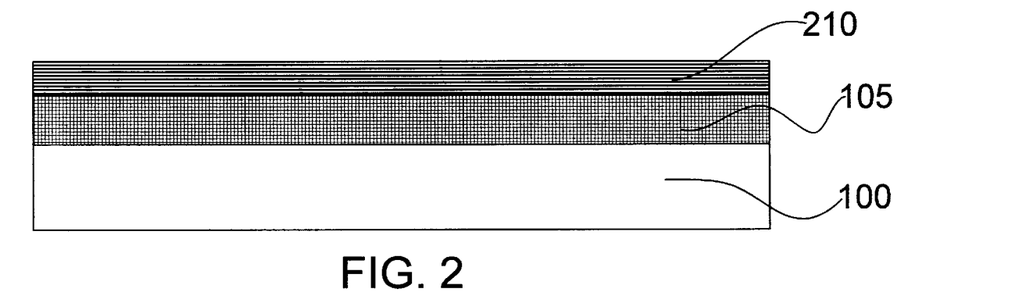

As shown in FIG. 2, a first dielectric layer 210 may be formed above the semiconducting layer 105. The first dielectric layer 210 may be formed by a variety of known techniques for forming such layers, including, but not limited to, thermal growing, CVD, PVD, LPCVD, PECVD, and the like, and may have a thickness ranging from approximately 50–100 Å, for example. The first dielectric layer 210 may be formed from a variety of dielectric materials and may, for example, be an oxide (e.g., Ge oxide), a nitride (e.g., GaAs nitride), an oxynitride (e.g., GaP oxynitride), silicon dioxide ($SiO_2$), nitrogen-bearing $SiO_2$, silicon nitride ($Si_3N_4$), silicon oxynitride ($Si_xO_yN_z$), and the like. The first dielectric layer 210 may function as a stop layer and may be formed of any suitable material that is selective with respect to the etching of an overlying sacrificial layer 315 (see FIG. 3) to be described more fully below. In one illustrative embodiment, the first dielectric layer 210 is comprised of silicon nitride ($Si_3N_4$), having a thickness of approximately 50 Å, which is formed by a PECVD process for higher throughput.

Figure 3:
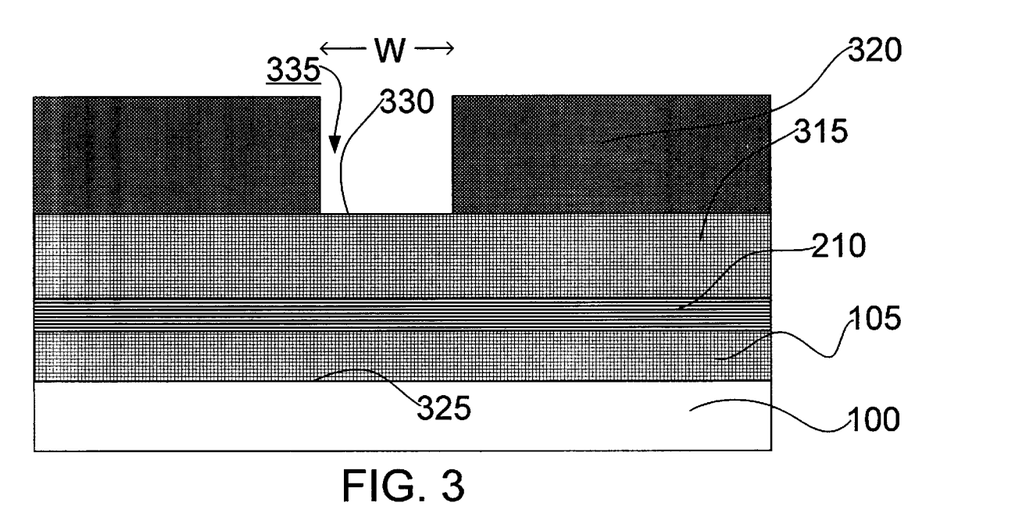

As shown in FIG. 3, a sacrificial layer 315 may be formed above the first dielectric layer 210. The sacrificial layer 315 may be formed by a variety of known techniques for forming such layers, e.g., CVD, PVD, LPCVD, PECVD, and the like, and may have a thickness ranging from approximately 1000–1500 Å. In one illustrative embodiment, the combined thickness of the semiconducting layer 105, the first dielectric layer 210 and the sacrificial layer 315 may be approximately 2000 Å, as measured from the top surface 325 of the substrate layer 100 to the top surface 330 of the sacrificial layer 315. For example, the semiconducting layer 105 may have a thickness of approximately 50 Å, the first dielectric layer 210 may have a thickness of approximately 50 Å, and the sacrificial layer 315 may have a thickness of approximately 1900 Å.

The sacrificial layer 315 may be formed from a variety of suitable materials and may, for example, be undoped Si—Ge, undoped polysilicon, aluminum (Al) or any relatively inexpensive dielectric material such as an oxide (e.g., Ge oxide), a nitride (e.g., GaAs nitride), an oxynitride (e.g., GaP oxynitride), silicon dioxide ($SiO_2$), nitrogen-bearing $Si_2$, silicon nitride ($Si_3N_4$), silicon oxynitride ($Si_xO_yN_z$), and the like. The sacrificial layer 315 may be formed of any suitable material that is selectively etchable with respect to an adjacent gate conductor 945 (see FIG. 9) for the illustrative transistor 1585A (see FIG. 15), as explained more fully below.

Eventually, as described more fully below, the sacrificial layer 315 will be removed. The sacrificial layer 315 is used to enable the formation of very shallow source/drain junctions in the transistor. In one illustrative embodiment, the sacrificial layer 315 is comprised of undoped Si—Ge, having a thickness of approximately 1900 Å, which is formed by an LPCVD process for higher throughput. The concentration of the Ge in the Si—Ge may be in a range of approximately 15–40%. Such a concentration of Ge in the Si—Ge enables relatively easy removal of the Si—Ge using a standard stripping solution used to clean wafers ("RCA solution"), which is a mixture of water ($H_2O$), sulfuric acid ($H_2SO_4$) and hydrogen peroxide ($H_2O_2$) in the approximate proportions 8:1:1. As in the deposition of polysilicon by LPCVD or PECVD, for example, the deposition of the Si—Ge may be accomplished by introducing approximately 15–40% (by volume or flow) germane ($GeH_4$) process gas along with silane ($SiH_4$) process gas into the process chamber during the deposition process.

Figure 4:
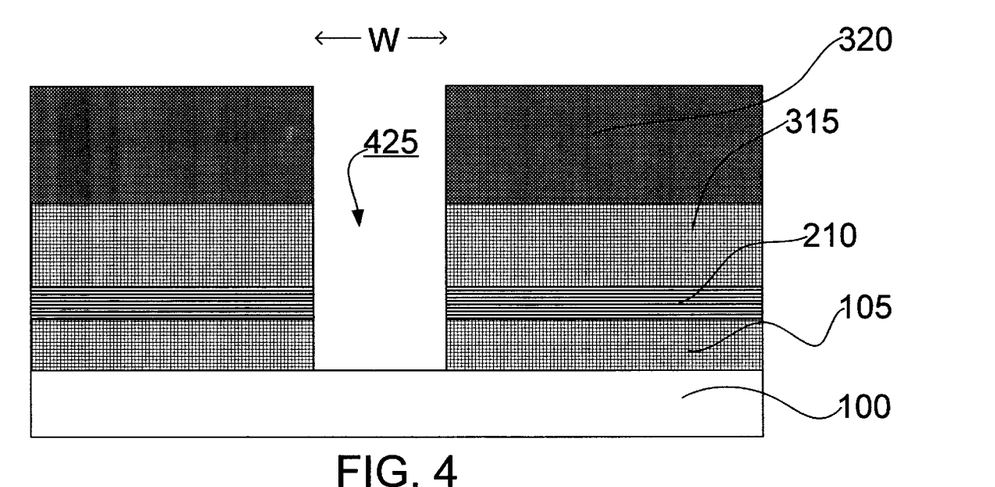
Figure 5:
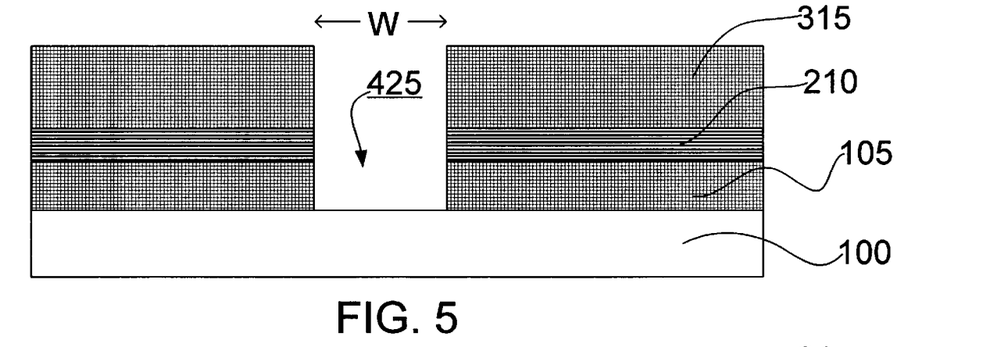

As shown in FIG. 3, a mask 320 of photoresist, for example, may be formed above the sacrificial layer 315 and may be patterned to define an opening 335. The mask 320 of photoresist may have a thickness ranging from approximately 10000–15000 Å (10 kÅ–15 kÅ), for example. As shown in FIGS. 3–4, using the mask 320 of photoresist, for example, the sacrificial layer 315, the first dielectric layer 210 and the semiconducting layer 105 may then be etched, forming an opening 425. As shown in FIG. 5, the mask 320 of photoresist, for example, may then be removed by being stripped off.

As shown in FIGS. 3–5, the opening 425 may be formed using a variety of known photolithography and etching techniques, such as an anisotropic etching process using hydrogen bromide (HBr) and argon (Ar) as the etchant gases, for example. The opening 425 may have a width W that may be varied as a matter of design choice. For example, the width W of the opening 425 may range from approximately 1000–2000 Å. The region in the substrate layer 100 underlying the opening 425 will eventually form the channel region 1165 (see FIG. 11) of the transistor 1585A (see FIG. 15).

Figure 6:
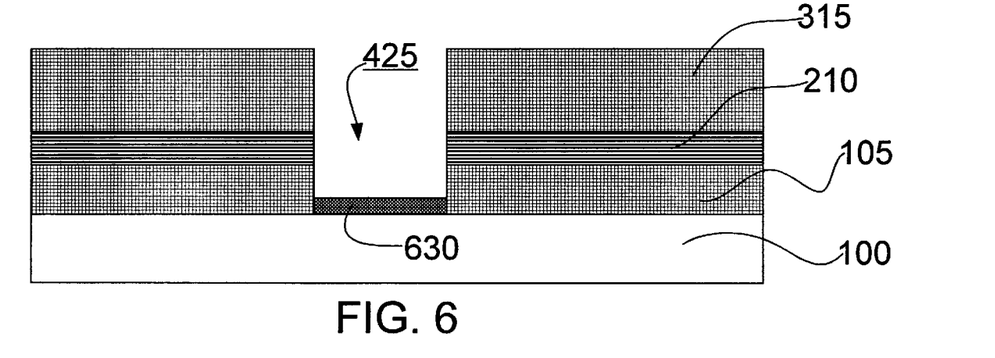

As shown in FIG. 6, a second dielectric layer 630 may be formed above the substrate layer 100 within the opening 425. The second dielectric layer 630, like the first dielectric layer 210, may be formed by a variety of known techniques for forming such layers, including, but not limited to, thermal growing, CVD, PVD, LPCVD, PECVD, and the like, and may have an equivalent oxide thickness $t_{ox\text{-}eq}$ ranging from approximately 4–8 Å, for example. An equivalent oxide thickness $t_{ox\text{-}eq}$ may be defined to be the thickness $t$ of a dielectric material (with a dielectric constant $K$) that would have a capacitance $C$ that is approximately the same as the capacitance $C_{ox}$ that a thickness $t_{ox\text{-}eq}$ of silicon dioxide ($SiO_2$) would have. Since $SiO_2$ has a dielectric constant $K_{ox}$ of approximately 4, and since $C=K/t$ and $C_{ox}=K_{ox}/t_{ox\text{-}eq}$, then $t=K/C=K/C_{ox}=Kt_{ox\text{-}eq}/K_{ox}=Kt_{ox\text{-}eq}/4$, approximately. For example, if the second dielectric layer 315 were formed of silicon nitride ($Si_3N_4$) with a dielectric constant $K_{nitride}$ of approximately 8, then an equivalent oxide thickness $t_{ox\text{-}eq}$ ranging from approximately 4–8 Å would correspond to a nitride thickness $t_{nitride}$ ranging from approximately 8–16 Å.

The second dielectric layer 630, like the first dielectric layer 210, may be formed from a variety of dielectric materials and may, for example, be an oxide (e.g., Ge oxide), a nitride (e.g., GaAs nitride), an oxynitride (e.g., GaP oxynitride), silicon dioxide ($SiO_2$), nitrogen-bearing $SiO_2$, silicon nitride ($Si_3N_4$), silicon oxynitride ($Si_xO_yN_z$), and the like. In one illustrative embodiment, the second dielectric layer 630A is comprised of $Si_3N_4$, having a thickness of approximately 8 Å, which is formed by an LPCVD process for higher throughput.

Figure 7:
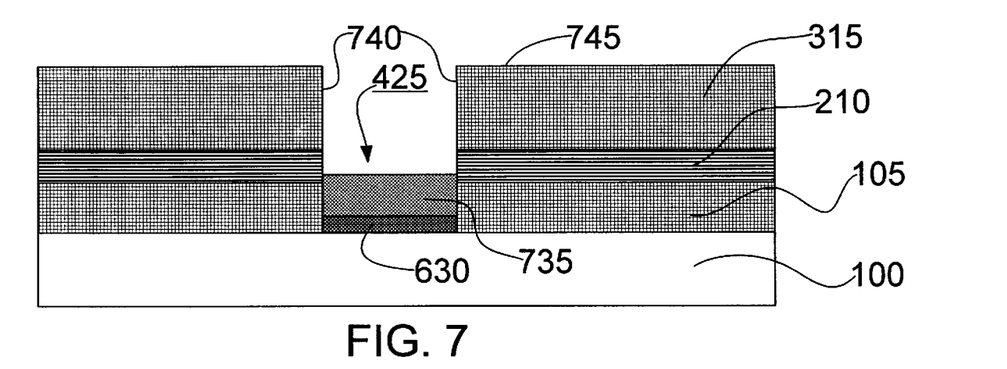

As shown in FIG. 7, a gate dielectric 735 may be formed above the second dielectric layer 630 in the opening 425. The gate dielectric 735 may be formed by a variety of known techniques for forming such a structure, including, but not limited to, thermal growing, CVD, PVD, LPCVD, PECVD, and the like, and may have an equivalent oxide thickness $t_{ox\text{-}eq}$ ranging from approximately 7–12 Å. For example, if the gate dielectric 735 were formed of tantalum oxide ($Ta_xO_y$, e.g., $Ta_2O_5$) with a dielectric constant $K_{TaO}$ of approximately 24, then, using $t=K_{TaO}/C=K_{TaO}/C_{ox}=K_{TaO}t_{ox\text{-}eq}/K_{ox}=24t_{ox\text{-}eq}/4$, approximately, an equivalent oxide thickness $t_{ox\text{-}eq}$ ranging from approximately 7–12 Å would correspond to a BST thickness $t_{TaO}$ ranging from approximately 42–72 Å. Alternatively, if the gate dielectric 735 were formed of barium strontium titanate (BST, $BaTiO_3/SrTiO_3$) with a dielectric constant $K_{BST}$ of approximately 250, then, using $t=K_{BST}/C=K_{BST}/COX=K_{BST}t_{ox\text{-}eq}/K_{ox}=250t_{ox\text{-}eq}/4$, approximately, an equivalent oxide thickness $t_{ox\text{-}eq}$ ranging from approximately 7–12 Å would correspond to a BST thickness $t_{BST}$ ranging from approximately 437–750 Å.

The gate dielectric 735 may be formed from a variety of dielectric materials and may, for example, be an oxide (e.g., Ge oxide), a nitride (e.g., GaAs nitride), an oxynitride (e.g., GaP oxynitride), silicon dioxide ($SiO_2$), nitrogen-bearing $SiO_2$, silicon nitride ($Si_3N_4$), silicon oxynitride ($Si_xO_yN_z$), and the like. The gate dielectric 735 may be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. In one illustrative embodiment, the gate dielectric 735 is comprised of $Ta_xO_y$, having a thickness of approximately 72 Å, which is formed by an LPCVD process for higher throughput.

In another illustrative embodiment, as shown in FIG. 15, the gate dielectric 1535 may be a single layer. The gate dielectric 1535 in this embodiment may be comprised of BST, having a thickness of approximately 450 Å. Also, in this embodiment, the semiconducting layer 1505 may have a thickness of approximately 400 Å and the first dielectric layer 1510 may have a thickness of approximately 100 Å.

Whether the dielectric material beneath the gate conductor 945 (see FIG. 9) is a single layer (see FIG. 15) or multiple layers (see FIGS. 9–14), the total physical thickness of the dielectric material beneath the gate conductor 945 (see FIG. 9) may be greater than the thickness of the semiconducting layer 105 or 1505. This may improve the isolation of the gate conductor 945 (see FIG. 9) of the transistor 1585A (see FIG. 15) from the source/drain regions 1155 and 1160 (see FIG. 11) of the illustrative transistor 1585A (see FIG. 15) that will eventually be formed, as described more fully below.

Additionally, the use of high K materials for the dielectric material beneath the gate conductor 945 (see FIG. 9), whether as a single layer (see FIG. 15) or multiple layers (see FIGS. 9–14), increases the total physical thickness of the dielectric material beneath the gate conductor 945 (see FIG. 9) as compared with the use of $SiO_2$, for example. Generally, the thicker the gate dielectric layer, the harder it is for charge carriers such as electrons to tunnel quantum mechanically through the gate dielectric layer between the channel region 1165 (see FIG. 11) and the gate conductor 945 (see FIG. 9) of the illustrative transistor 1585A (see FIG. 15), for example. Since the high K materials have a higher dielectric constant $K_{high}$ than the $K_{ox}$ of approximately 4 for $SiO_2$, a thicker layer of high K material, having a thickness of $t_{highK}$, may have substantially the same capacitance $C_{ox}$ that an "ultrathin" layer of $SiO_2$, having a thickness $t_{ox}$, would have. Indeed, since $C_{ox}=K_{ox}/t_{ox}=C_{highK}=K_{high}/t_{highK}$, then $t_{highK}/t_{ox}=K_{high}/K_{ox}=K_{high}/4$, approximately. Therefore, having $K_{high}$ greater than about 4, leads to $t_{highK}$ being greater than $t_{ox}$, leading to much less quantum mechanically tunneling through a high K material that has an equivalent oxide thickness $t_{ox\text{-}eq}$ than through $SiO_2$ that has a thickness $t_{ox}=t_{ox\text{-}eq}$.

In yet another illustrative embodiment, the gate dielectric 735 may be comprised of $SiO_2$, having a thickness of approximately 12 Å, which is thermally grown for higher throughput. In such an embodiment, the $SiO_2$ may also thermally grow on any surface where silicon (Si) may be exposed, such as on portions of the sidewalls 740 within the opening 425 and above the upper surface 745 of the sacrificial layer 315. The sacrificial layer 315 will eventually be removed, as described more fully below. The $SiO_2$ thermally grown on portions of the sidewalls 740 within the opening 425 may improve the isolation of the gate conductor 945 (see FIG. 9) of the transistor 1585A (see FIG. 15) from the source/drain regions 1155 and 1160 (see FIG. 11) of the transistor 1585A (see FIG. 15) that will eventually be formed, as described more fully below.

Figure 8:
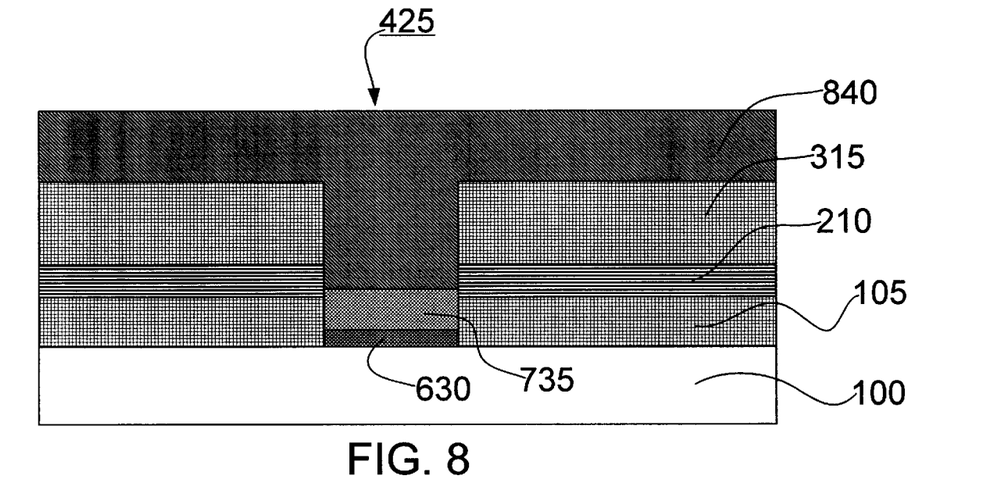
Figure 9:
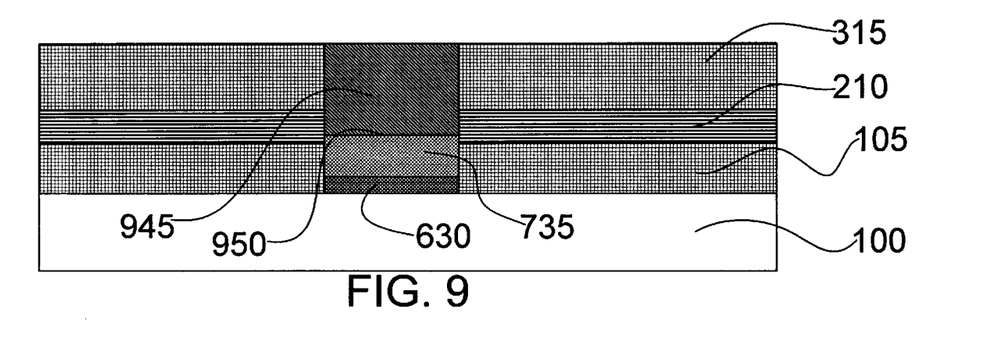

As shown in FIGS. 8 and 9, a gate conductor 945 is formed above the gate dielectric 735. The gate conductor 945 may be formed by first forming a conductive layer 840 above the sacrificial layer 315 and above the gate dielectric 735 within the opening 425, and then planarizing the conductive layer 840. The conductive layer 840 may be formed by a variety of known techniques for forming such layers, e.g., CVD or LPCVD, and may have a thickness ranging from approximately 1000–1500 Å. In one illustrative embodiment, portions of the conductive layer 840 will become, upon salicidation, the gate conductor 945 for the transistor 1585A (see FIG. 15). In one such illustrative embodiment, the gate conductor 945 is comprised of doped polysilicon, having a thickness (measured from the top surface 950 of the gate dielectric 735) of approximately 1920 Å, which is formed by an LPCVD process for higher throughput. Also, in this embodiment the gate dielectric 735 is comprised of $Ta_xO_y$, having a thickness of approximately 72 Å, the second dielectric layer 630A is comprised of $Si_3N_4$, having a thickness of approximately 8 Å, the semiconducting layer 105 has a thickness of approximately 50 Å and the first dielectric layer 210 has thickness of approximately 50 Å.

The conductive layer 840 may be formed of aluminum (Al), tungsten (W), tantalum (Ta), titanium (Ti), Cobalt (Co) or copper (Cu), and the like. Alternatively, the conductive layer 840 may be formed of doped polysilicon that is then subjected to a final anneal to render the doped polysilicon more conductive.

The conductive layer 840 may be planarized by polishing, for example. In particular, the conductive layer 840 may be planarized by chemical mechanical polishing (CMP), for example. As shown in FIGS. 8 and 9, the planarization of the conductive layer 840 may also planarize the upper portions of the sacrificial layer 315. Alternatively, the planarization of the conductive layer 840 may be stopped as soon as the upper portions of the sacrificial layer 315 are exposed, so that the upper portions of the sacrificial layer 315 would not be planarized to any great extent, or at all.

Figure 10:
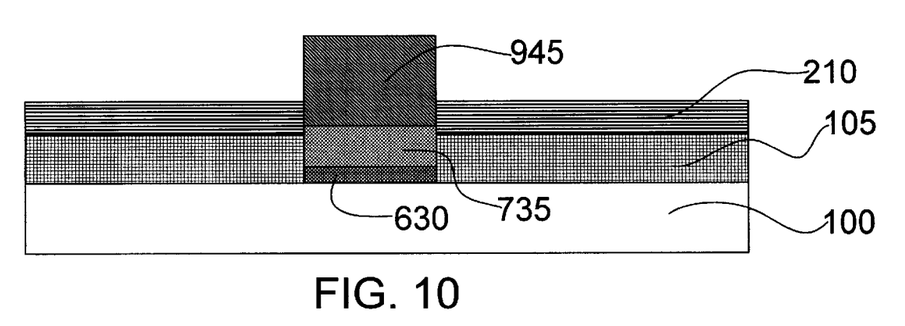

As shown in FIG. 10, the sacrificial layer 315 may be removed to expose the first dielectric layer 210 and the sides of the gate conductor 945. The sacrificial layer 315 may be removed by etching or cleaning, for example. The etching to remove the sacrificial layer 315 may be anisotropic, such as reactive ion etching (RIE), for example. Alternatively, the etching to remove the sacrificial layer 315 may be isotropic, using the selective etchability of the sacrificial layer 315 relative to the dielectric layer 210 and the gate conductor 945, for example. The etch may be a plasma or dry etch, or, alternatively, a wet chemical etch. As an example of a wet chemical etch, a 10:1 hydrogen fluoride (HF)/water ($H_2O$) solution may be used.

In one illustrative embodiment, as described above, the sacrificial layer 315 may be comprised of undoped Si—Ge, having a thickness of approximately 1900 Å, which is formed by an LPCVD process. The concentration of the Ge in the Si—Ge may be in the range of approximately 15–40% that enables relatively easy and convenient removal of the Si–Ge using the standard RCA stripping solution used to clean wafers, as described above, which is a mixture of water ($H_2O$), sulfuric acid ($H_2SO_4$) and hydrogen peroxide ($H_2O_2$) in the proportions 8:1:1.

Figure 11:
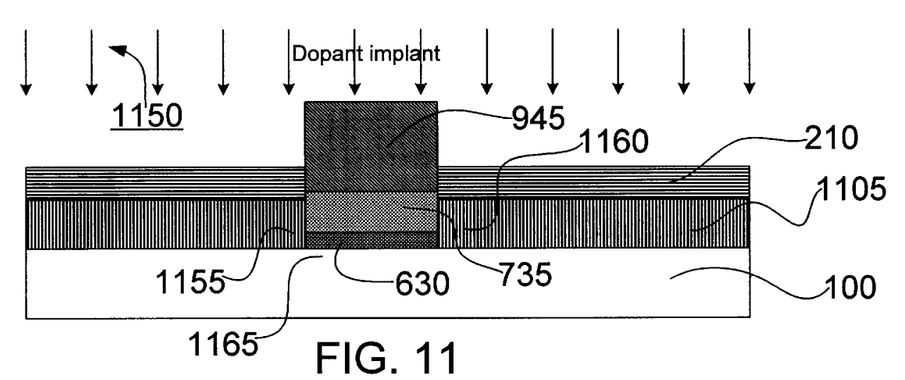

As shown in FIG. 11, a dopant 1150 (indicated by arrows) may be implanted to introduce dopant atoms or molecules to form doped source/drain regions 1155 and 1160. In particular, the dopant 1150 may be implanted into the semiconducting layer 105 on either side of the gate conductor 945, transforming an undoped semiconducting layer 105 into a doped semiconducting layer 1105. During this implantation process, the gate conductor 945 acts as a barrier to prevent the dopant 1150 atoms or molecules from penetrating through the gate conductor 945 into the channel region 1165 of the substrate layer 100 lying beneath the gate conductor 945.

In one illustrative embodiment, the dose of dopant 1150 atoms or molecules may range from approximately $2.0 \times 10^{15} - 9.0 \times 10^{15}$ ions/$cm^2$ of the appropriate dopant 1150 atoms or molecules, e.g., arsenic (As) for an illustrative N-channel MOSFET (NMOS transistor or NMOS) or boron (B) for an illustrative P-channel MOSFET (PMOS transistor or PMOS). The implant energy of the dopant 1150 atoms or molecules may range from approximately 800 eV to 5 keV, and may lead to a relatively shallow implant. The peak of the implant may be located approximately at the interface between the semiconducting layer 105 and the first dielectric layer 210. In another illustrative embodiment, the dose of dopant 1150 atoms is approximately $2.0 \times 10^{15}$ ions/$cm^2$ of arsenic (As) for an N-channel MOSFET (NMOS transistor or NMOS) or boron (B) for a P-channel MOSFET (PMOS transistor or PMOS) at an implant energy of approximately 800 eV.

The dopant 1150 may be an $N^+$ implant, for example, such as phosphorus (P), arsenic (As), nitrogen (N), antimony (Sb), or bismuth (Bi) and the like, and may form heavily doped $N^+$ source/drain regions 1155 and 1160. An $N^+$ implant would be appropriate for the fabrication of an NMOS, for example. Alternatively, dopant 1150 may be a $P^+$ implant, for example, such as boron (B), aluminum (Al), gallium (Ga), Indium (In) or Thallium (Tl) and the like, and may form heavily doped $P^+$ source/drain regions 1155 and 1160. A $P^+$ implant would be appropriate for the fabrication of a PMOS, for example. In one illustrative embodiment, the use of a nitride for the first dielectric layer 210 may keep the relatively lightweight and mobile boron atoms of a $P^+$ implant from migrating upwards.

The semiconductor device may next be subjected to a heat-treating process to drive the dopant 1150 atoms or molecules throughout the source/drain regions 1155 and 1160. The heat-treating process may be performed by a variety of known techniques. For example, the heat-treating process may be a rapid thermal anneal (RTA) process performed at a temperature ranging from approximately 1050–1200° C. for a time ranging from approximately 60 seconds to 2 minutes. Alternatively, the heat-treating process may be performed in a traditional tube furnace at a temperature ranging from approximately 1000–1150° C. for a time period ranging from approximately 30–90 minutes.

As will be recognized by one skilled in the art, the doping of the source/drain regions 1155 and 1160 may be accomplished by a variety of different techniques. For example, if desired, the appropriate dopant 1150 atoms or molecules may be added during the formation of the semiconducting layer 105, i.e., dopant atoms or molecules, such as arsenic, may be added during the deposition process used to form the semiconducting layer 105. Alternatively, an undoped semiconducting layer 105 may be formed and thereafter subjected to an ion implantation process and heat-treating process before etching is performed to define the opening 425. As will be known to those skilled in the art, there are a variety of other techniques and methods for introducing dopant atoms or molecules into the portion of the semiconducting layer 105 that will ultimately become the source/drain regions 1155 and 1160. Thus, the particular technique used to accomplish this objective should not be considered a limitation of the present invention.

Figure 12:
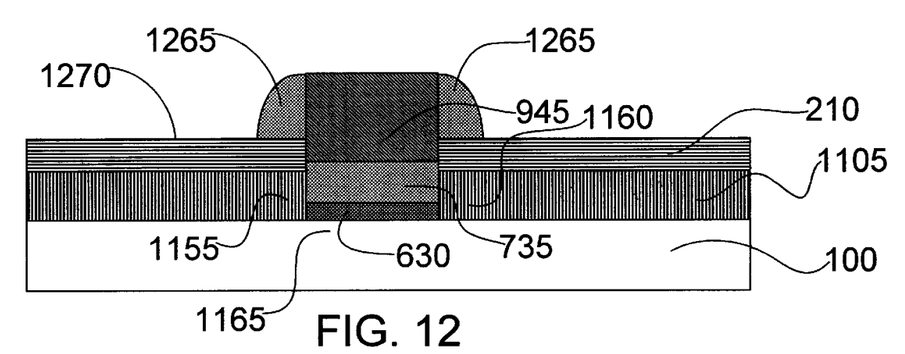

As shown in FIG. 12, dielectric spacers 1265 may be formed on the sides of the gate conductor 945 by a variety of techniques. For example, the dielectric spacers 1265 may be formed by depositing a conformal layer of the appropriate material above and adjacent the gate conductor 945 and then performing an anisotropic reactive ion etching (RIE) process on the conformally blanket-deposited layer. Alternatively, the dielectric spacers 1265 may be formed by being selectively thermally grown on the sides of a polysilicon gate conductor 945, since $SiO_2$ may thermally grow on any surface where silicon (Si) may be exposed. The dielectric spacers 1265 may each have a base thickness (measured horizontally from the sides of the gate conductor 945 at the top surface 1270 of the first dielectric layer 210) ranging from approximately 150–600 Å, for example. The dielectric spacers 1265, like the first and second dielectric layers 210 and 630, may be formed from a variety of dielectric materials and may, for example, be an oxide (e.g., Ge oxide), a nitride (e.g., GaAs nitride), an oxynitride (e.g., GaP oxynitride), silicon dioxide ($SiO_2$), nitrogen-bearing $SiO_2$, silicon nitride ($Si_3N_4$), silicon oxynitride ($Si_xO_yN_z$), and the like. In one illustrative embodiment, the dielectric spacers 1265 are comprised of $SiO_2$, having a base thickness of approximately 150 Å.

Figure 13:
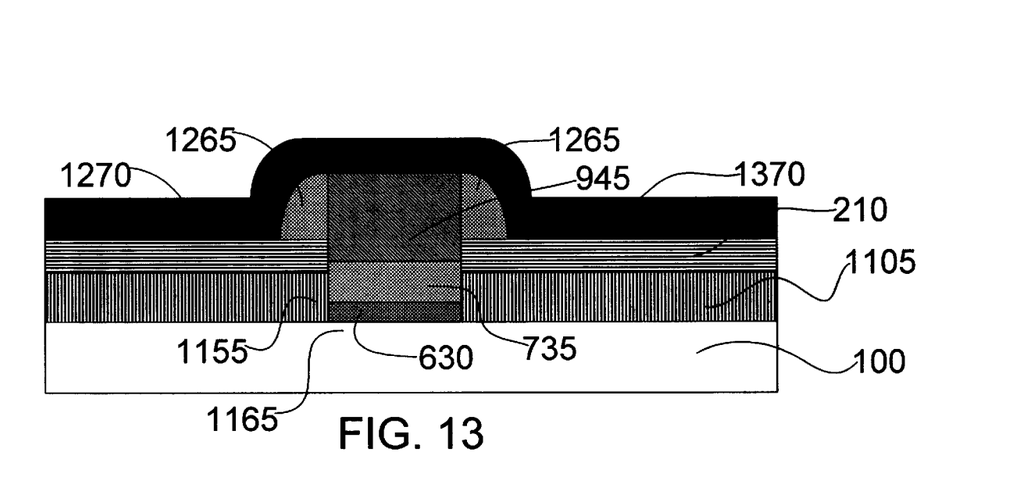
Figure 14:
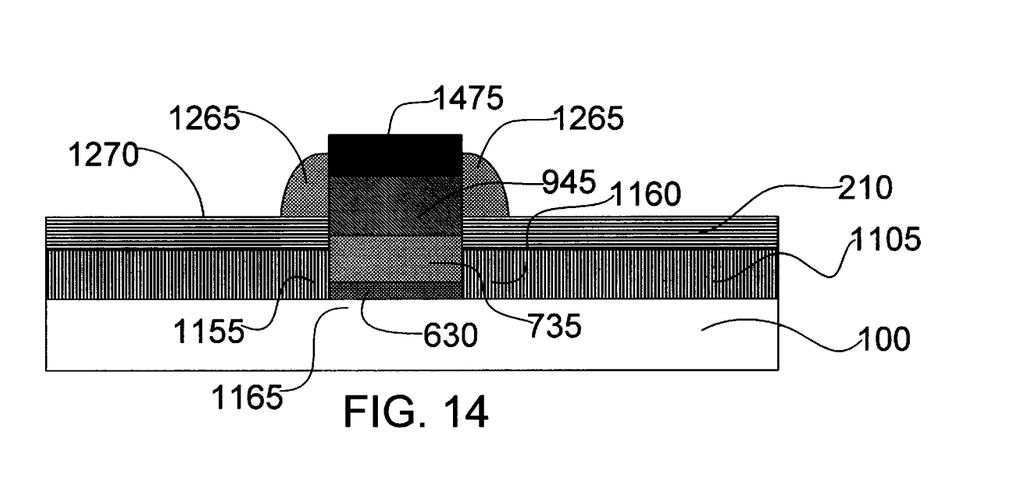

As shown in FIGS. 13 and 14, if desired or necessary, a polysilicon gate conductor 945 may be subjected to a self-aligned silicidation (salicidation) process to make the gate conductor 945 more conductive. In particular, a self-aligned silicided (salicided) gate layer 1475 may be formed only above a doped polysilicon gate conductor 945. The salicided gate layer 1475 may be formed by first forming a saliciding layer 1370 above the first dielectric layer 210, adjacent the dielectric spacers 1265 and above the doped polysilicon gate conductor 945. Thereafter, the transistor is subjected to a heat-treating process to convert the saliciding layer 1370 into a metal silicide. It is believed that only upper portions of the doped polysilicon gate conductor 945 would be consumed to form the metal silicide of the salicided gate layer 1475, and that the first dielectric layer 210 and the dielectric spacers 1265 would prevent silicide formation on the first dielectric layer 210 and the dielectric spacers 1265, facilitating the self-alignment of the salicidization process. The salicidization process renders the doped polysilicon gate conductor 945 even more conductive by providing the salicided gate layer 1475, lowering the overall resistivity of the gate of the transistor.

The saliciding layer 1370 may be formed by a variety of known techniques for forming such layers, e.g., CVD or LPCVD, and may have a thickness ranging from approximately 1000–2000 Å. In one illustrative embodiment, the saliciding layer 1370 is comprised of cobalt (Co), having a thickness (measured from the top surface 1270 of the first dielectric 210) of approximately 1000 Å, which is blanket-deposited, for example, in a nitride ambient, by an LPCVD process for higher throughput. The saliciding layer 1370 may be formed of aluminum (Al), tungsten (W), tantalum (Ta), titanium (Ti), cobalt (Co), or copper (Cu), and the like.

As stated previously, the present invention may be used to form a plurality of transistors above other previously formed transistors, i.e., the present invention may be used to form multiple layers of transistors. For example, as shown in FIG. 15, a semiconductor device, such as a MOS structure 1500B similar to the MOS structure as shown in FIG. 14, is formed above another semiconductor device, such as CMOS structure 1500A. As shown in FIG. 15, the CMOS structure 1500A is an example of a structure 100 as shown in FIGS. 1–14. The transistor 1585A in the MOS structure 1500B may be an NMOS or a PMOS. The transistor 1585B in the CMOS structure 1500A may be an NMOS or a PMOS, while the transistor 1585C in the CMOS structure 1500A may be a PMOS or an NMOS, respectively. The transistors 1585B and 1585C in the CMOS structure 1500A may be separated by a trench isolation dielectric structure 1590. The dielectric layer 1595 separates and isolates the transistor 1585A in the MOS structure 1500B from the transistors 1585B and 1585C in the CMOS structure 1500A.

Any of the above-disclosed embodiments of a method for fabricating a transistor according to the present invention provides for enhanced junction control and increased operating speed and performance of the transistor. Additionally, the present invention allows formation of ultrathin gate dielectric layers and very shallow source/drain junctions.

Furthermore, the above-disclosed embodiments of methods for transistor fabrication according to the present invention enable transistor fabrication with increased device density and precision and enable a streamlined and simplified process flow, thereby decreasing the complexity and lowering the costs of the manufacturing process and increasing throughput.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for fabricating a transistor, the method comprising:

forming a semiconducting layer above a substrate layer;

forming a first dielectric layer above the semiconducting layer;

forming a sacrificial layer above the first dielectric layer;

forming an opening in the sacrificial layer, the first dielectric layer and the semiconducting layer to expose a channel region in the substrate layer;

forming a gate dielectric above the channel region in the substrate layer within the opening;

forming a gate conductor above the gate dielectric within the opening;

removing the sacrificial layer to expose sides of the gate conductor;

introducing a dopant into the semiconducting layer to form doped source/drain regions; and forming dielectric spacers adjacent the gate conductor.

2. The method of claim 1, wherein the formation of the gate dielectric further comprises:

forming a second dielectric layer above the channel region on the substrate layer within the opening; and forming a third dielectric layer above the second dielectric layer within the opening, wherein the formation of the gate conductor further comprises:

forming a conductive layer above the sacrificial layer and above the gate dielectric within the opening; and planarizing the conductive layer to be disposed only above the gate dielectric within the opening, and wherein the introduction of the dopant into the semiconducting layer further comprises:

implanting the dopant into the semiconducting layer to form the doped source/drain regions.

3. The method of claim 1, wherein the semiconducting layer comprises silicon and germanium.

4. The method of claim 1, wherein the semiconducting layer and the sacrificial layer are formed by deposition.

5. The method of claim 1, wherein the formation of the opening includes etching.

6. The method of claim 1, wherein the removal of the sacrificial layer includes one of cleaning and etching, and the one of cleaning and etching stops at the first dielectric layer.

7. The method of claim 2, wherein the first, second and third dielectric layers are formed by deposition.

8. The method of claim 2, wherein the planarization of the conductive layer includes chemical mechanical polishing.

9. The method of claim 2, wherein the conductive layer is formed by deposition.

10. The method of claim 9, wherein the conductive layer includes polysilicon and the formation of the gate conductor further comprises:

saliciding the conductive layer.

11. A method for MOSFET fabrication, the method comprising:

depositing a semiconducting layer above a substrate layer;

depositing a first dielectric layer above the semiconducting layer;

depositing a sacrificial layer above the first dielectric layer;

etching an opening in the sacrificial layer, the first dielectric layer and the semiconducting layer to expose a channel region in the substrate layer;

depositing a second dielectric layer above the channel region on the substrate layer in the opening;

depositing a gate dielectric layer above the second dielectric layer in the opening;

depositing a conductive layer above the sacrificial layer and above the gate dielectric layer in the opening;

polishing the conductive layer to be disposed only above the gate dielectric layer in the opening;

removing the sacrificial layer to expose sides of the conductive layer;

implanting a dopant into the semiconducting layer to form doped source/drain regions;

forming dielectric spacers on the sides of the conductive layer; and forming a conductive gate by saliciding the conductive layer.

12. The method of claim 11, wherein the semiconducting layer comprises silicon and germanium.

13. The method of claim 11, wherein the polishing of the conductive layer includes chemical mechanical polishing.

14. The method of claim 11, wherein the removal of the sacrificial layer includes one of cleaning and etching, and the one of cleaning and etching stops at the first dielectric layer.

15. The method of claim 11, wherein the saliciding includes deposition of cobalt above the first dielectric layer, above the dielectric spacers and above the conductive layer.

16. A method for MOSFET fabrication, the method comprising:

depositing a semiconducting layer above a substrate layer, the semiconducting layer having a thickness in a range of about 100 Å–500 Å;

depositing a first dielectric layer above the semiconducting layer, the first dielectric layer having a thickness in a range of about 50 Å–100 Å;

depositing a sacrificial layer above the first dielectric layer, the sacrificial layer having a thickness in a range of about 1000 Å–1500 Å;

etching an opening in the sacrificial layer, the first dielectric layer and the semiconducting layer to expose a channel region in the substrate layer;

depositing a second dielectric layer above the channel region in the substrate layer in the opening, the second dielectric layer having an equivalent oxide thickness in a range of about 4 Å–8 Å;

depositing a gate dielectric layer above the second dielectric layer in the opening, the gate dielectric layer having an equivalent oxide thickness in a range of about 7 Å–12 Å;

depositing a conductive layer above the sacrificial layer and above the gate dielectric layer in the opening, the conductive layer having a thickness in a range of about 1000 Å–1500 Å;

polishing the conductive layer using chemical mechanical polishing to be disposed only above the gate dielectric layer in the opening;

removing the sacrificial layer to expose sides of the conductive layer;

implanting a dopant into the semiconducting layer to form doped source/drain regions, a dose of dopant atoms or molecules ranging from about $2.0 \times 10^{15}$–$9.0 \times 10^{15}$ ions/$cm^2$ at an implant energy in a range of about 0.8–5 keV;

forming dielectric spacers on the sides of the conductive layer, the dielectric spacers having a base thickness in a range of about 150 Å–600 Å; and forming a conductive gate by saliciding the conductive layer.

17. The method of claim 16, wherein the sacrificial layer includes one of about fifteen to about forty percent germanium in silicon, aluminum, polysilicon and a dielectric material.

18. The method of claim 16, wherein semiconducting layer includes silicon and germanium, the first dielectric layer includes a nitride, the sacrificial layer includes silicon and germanium, the second dielectric layer includes a nitride, the gate dielectric layer includes a high dielectric constant material, with a dielectric constant K at least about 8, the conductive layer includes polysilicon, the dielectric spacers include silicon dioxide and the saliciding includes using cobalt.

19. The method of claim 16, wherein the semiconducting layer has a thickness of about 100 Å, the first dielectric layer has a thickness of about 50 Å, the sacrificial layer has a thickness of about 1000 Å, the second dielectric layer has an equivalent oxide thickness of about 4 Å, the gate dielectric layer has an equivalent oxide thickness of about 7 Å, the conductive layer has a thickness of approximately 1000 Å and the dielectric spacers have a base thickness of about 100 Å.

20. The method of claim 16, wherein the semiconducting layer is formed by a first LPCVD processing step, the first dielectric layer is formed by a PECVD processing step, the sacrificial layer is formed by a second LPCVD processing step, the second dielectric layer is formed by a third LPCVD processing step, the gate dielectric layer is formed by a fourth LPCVD processing step and the dielectric spacers are formed by a fifth LPCVD processing step.

* * * * *